United States Patent [19]
Bojarczuk, Jr. et al.

[11] Patent Number: 5,895,932
[45] Date of Patent: Apr. 20, 1999

[54] HYBRID ORGANIC-INORGANIC SEMICONDUCTOR LIGHT EMITTING DIODES

[75] Inventors: Nestor A. Bojarczuk, Jr., Poughkeepsie; Supratik Guha, Yorktown Heights; Richard Alan Haight, Mahopac, all of N.Y.

[73] Assignee: International Business Machines Corporation, Armonk, N.Y.

[21] Appl. No.: 08/811,990

[22] Filed: Mar. 5, 1997

Related U.S. Application Data

[63] Continuation-in-part of application No. 08/788,509, Jan. 24, 1997.
[51] Int. Cl.$^6$ ........................................... H01L 33/00
[52] U.S. Cl. ............................ 257/103; 257/81; 257/99; 257/102
[58] Field of Search ........................... 257/81, 99, 102, 257/103

[56] References Cited

U.S. PATENT DOCUMENTS 4,035,774  7/1977  Chang ........................ 340/166

*Primary Examiner*—Ngân V. Ngô
*Attorney, Agent, or Firm*—Stephen S. Strunck

[57] ABSTRACT

This invention provides a novel hybrid organic-inorganic semiconductor light emitting diode. The device consists of an electroluminescent layer and a photoluminescent layer. The electroluminescent layer is an inorganic GaN light emitting diode structure that is electroluminescent in the blue or ultraviolet (uv) region of the electromagnetic spectrum when the device is operated. The photoluminescent layer is a photoluminescent organic thin film such as tris-(8-hydroxyquinoline) Al, Alq3, deposited onto the GaN LED and which has a high photoluminescence efficiency. The uv emission from the electroluminescent region excites the Alq3 which photoluminesces in the green. Such a photoconversion results in a light emitting diode that operates in the green (in the visible range). Other colors such as blue or red may be obtained by appropriately doping the Alq3. Furthermore, other luminescent organics in addition to Alq3 may be used to directly convert the uv or blue to other wavelengths of interest. The invention provides the benefits of simplicity and ease of fabrication, since a complete redesign of the structure is not necessary to change emission wavelength, and the possibility for making displays by spatially varying the deposition of the emissive layer.

14 Claims, 11 Drawing Sheets

HYBRID ORGANIC-INORGANIC SEMICONDUCTOR LIGHT EMITTING DIODES

CROSS-REFERENCE TO RELATED APPLICATIONS

This application is a continuation-in-part of application Ser. No. 08/788,509, filed Jan. 24, 1997.

FIELD OF THE INVENTION

The general field of this invention is that of electroluminescent diodes. More particularly, the invention relates to the formation of hybrid light emitting diode structures from a combination of organic and inorganic semiconductor light emitting materials.

BACKGROUND OF THE INVENTION

The formation of conventional light emitting diodes (LEDs) made entirely from inorganic semiconductor materials such as GaAs and GaN has been extensively described in the literature such as in Chapter 12 of the Handbook of Optics, Vol. 1, McGraw Hill, Inc. (1995) ("Light Emitting Diodes" by R. H. Haitz et al.) and by S. Nakamura et al. in Appl. Phys. Lett. 64, 1687 (1994). Light emitting diodes made entirely from organic materials have also been described in the literature such as by C. W. Tang et al. in J. Appl. Phys. 65, 3610 (1989) and by C. W. Tang in Society for Information Display (SID) Digest, 181 (1996).

Semiconductor LEDs are widely used today. However, while robust blue, green, and red light emitting diodes are available, separate structures, materials, and growth processes are required to achieve the different colors thus resulting in completely different devices. Blue and green light emitting diodes are made of alloys of InGaAlN with each color requiring a uniquely different alloy composition. Red LEDs are made of InGaAsP which is an entirely different compound altogether.

Fully organic LEDs (OLEDs) offer the advantage that color can be changed from blue to red/orange by simply adding dyes in minute amounts to the optically active organic electroluminescent layer. Alternatively, color conversion can be achieved by coating the OLED with organic materials which act to convert the light emitted to longer wavelengths (color converters). However, limitations of OLEDs as the underlying light source include problems with degradation of diode performance during electrical operation and the unavailability of efficient blue emitting materials. An additional problem is that of the sensitivity of organic OLEDs to subsequent processing in that they cannot be subjected to temperatures above, typically, 100° C. and cannot be exposed to solvents such as water. These limitations call for more robust OLEDs.

SUMMARY OF THE INVENTION

This invention provides a novel hybrid organic-inorganic semiconductor light emitting diode. The device consists of an electroluminescent layer and a photoluminescent layer. The electroluminescent layer is an inorganic GaN based light emitting diode structure that is electroluminescent in the blue or ultraviolet (uv) region of the electromagnetic spectrum when the device is operated. The photoluminescent layer is a photoluminescent organic thin film deposited onto the GaN LED and which has a high photoluminescence efficiency. One such example is tris-(8-hydroxyquinoline) Al (commonly designated as Alq3 or AlQ). The uv emission from the electroluminescent region excites the Alq3 which photoluminesces in the green. Such a photoconversion results in a light emitting diode that operates in the green (in the visible range). Another example is the organic thin film composed of the dye 4-dicyanomethylene-2-methyl-6(p-dimethylaminostyryl)-4H-pyran, abbreviated to DCM. This material can absorb blue light and photoluminesce in the orange-red. One can therefore use a GaN based diode structure where the electroluminescence is in the blue (as can be obtained with a diode where the active region consists of Zn doped $Ga_{0.94}In_{0.06}N$ as described by S. Nakamura et al. in Appl. Phys. Lett. V64, 1687 (1994)), and coat it with a film of DCM to obtain red emission. Higher photoluminescence efficiencies may be obtained by doping an organic host with small amounts of other organic dopants. In essence, different luminescent organic dopant-host combinations may be used to directly convert the blue/uv electroluminescence to other wavelengths of interest such as green and red.

A major improvement over current state of the art light emitting diodes is thus formed by the inorganic/organic hybrids of this invention in which a robust device fabricated from GaN, or alloys of GaN with Al, In and N, produces uv to blue light which is efficiently converted to visible frequencies from 450 nm to 700 nm with organic dye layers deposited over the GaN LED.

Such an LED thus consists of a basic structure or "skeleton" which is the uv to blue light generator (the inorganic GaN layer) to which an appropriate emissive layer can be added in modular fashion to change the emission color of the LED. This provides the benefits of simplicity and ease of fabrication, since a complete redesign of the structure is not necessary to change emission wavelength, and the possibility for making displays by spatially varying the deposition of the emissive layer.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

Figure 1:
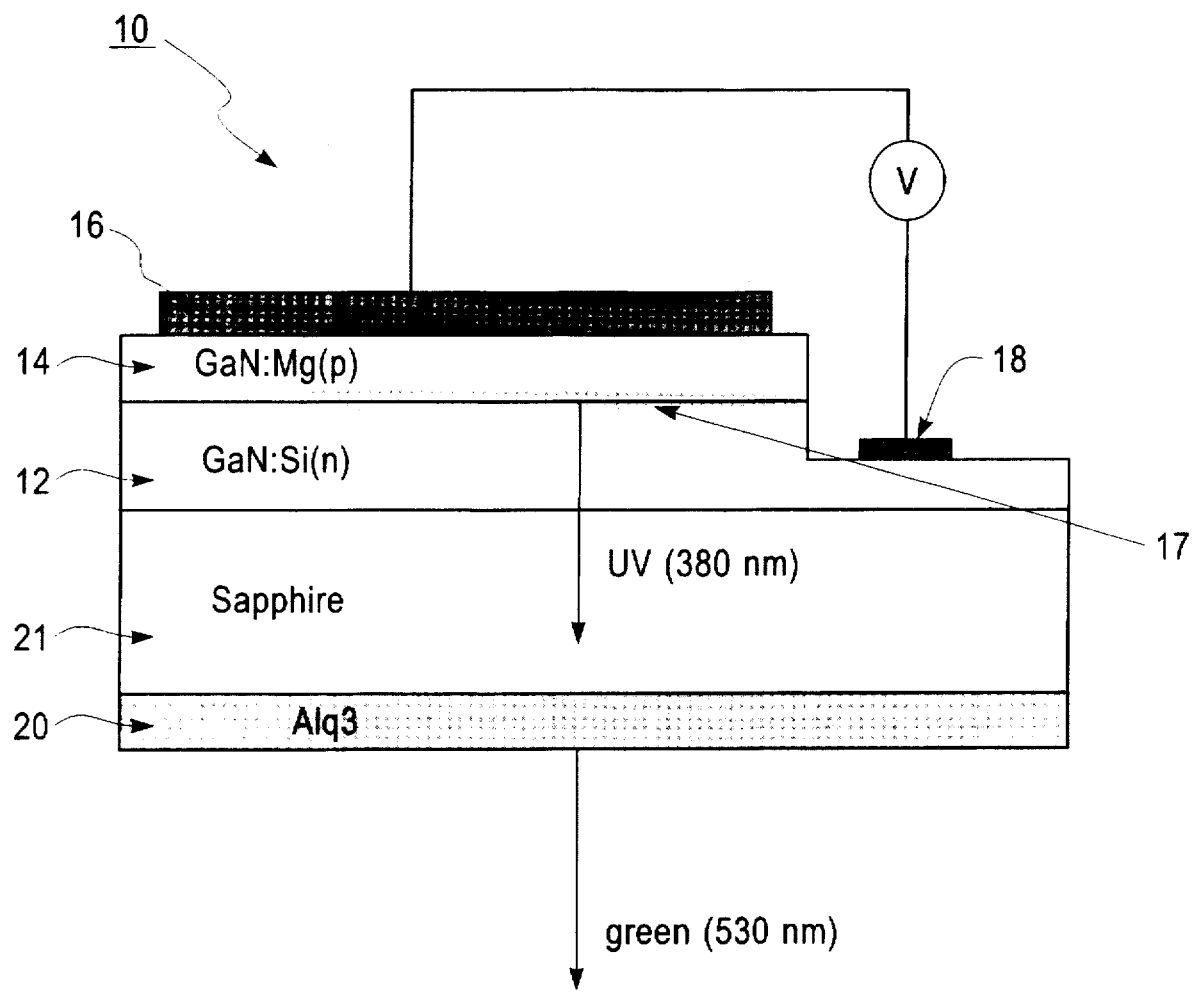
FIG. 1 is a schematic cross-section of the basic structure of a hybrid LED of the invention.

FIG. 1 shows the basic embodiment of the device of the invention which comprises a GaN based uv light emitting diode structure grown on a sapphire substrate coated with a simple color converter, Alq3. This device 10 consists of an n-doped GaN layer 12, followed by a p-doped GaN layer 14 grown in the following fashion. A sapphire wafer was inserted into a molecular beam epitaxy growth chamber and heated to 750° C. Following this, a 10 nm thick AlN nucleation layer (not shown) was grown by evaporating Al thermally and directing a flux of excited nitrogen atoms and molecules (excited by a radio frequency source) at the substrate. After the AlN growth, an n-type GaN layer doped with Si was grown by evaporating Ga and Si thermally and using the excited nitrogen flux. This was followed by growth of a p-type GaN layer doped with Mg, with the Mg evaporated thermally. This growth resulted in the structure consisting of 1.2 microns p-doped GaN/1.4 microns n-doped GaN/10 nm AlN/sapphire substrate. As used herein, GaN is shorthand for the compound $Ga_x Al_y In_{1-x-y} N$.

Following growth of the structure, an electrical contact 16 to p-layer 14 was made by electron beam vacuum deposition of Ni/Au/Al. Part of the device structure was then etched away by reactive ion etching (RIE) to expose n-doped region 12 for a second electrical contact 18.

The device was then inserted in a vacuum chamber and a thin layer 20 (150 nm to 1 micron) of Alq3 was deposited onto the device by thermal evaporation. In FIG. 1, the Alq3 was deposited onto sapphire substrate 21. Alq3 layer 20 (the photoluminescent layer) converts the 380 nm light emitted from the GaN LED into 530 nm light.

Figure 2:
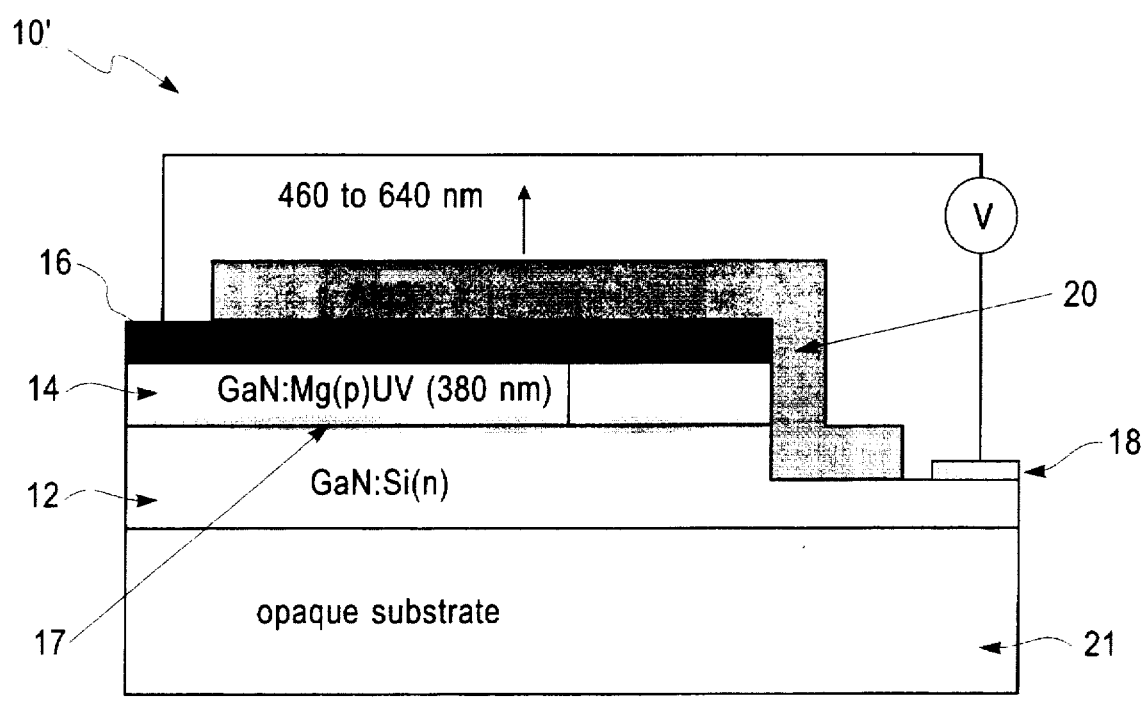
FIG. 2 is a schematic cross-section of a different embodiment of the basic structure of FIG. 1.

In cases where the substrate may not be transparent, such as is the case for Si substrates, the photoluminescent organic thin film 20 can be deposited directly on the GaN, as shown in FIG. 2. Here, layer 20 will be thinner than in the device of FIG. 1 to permit light transmission.

Figure 3:
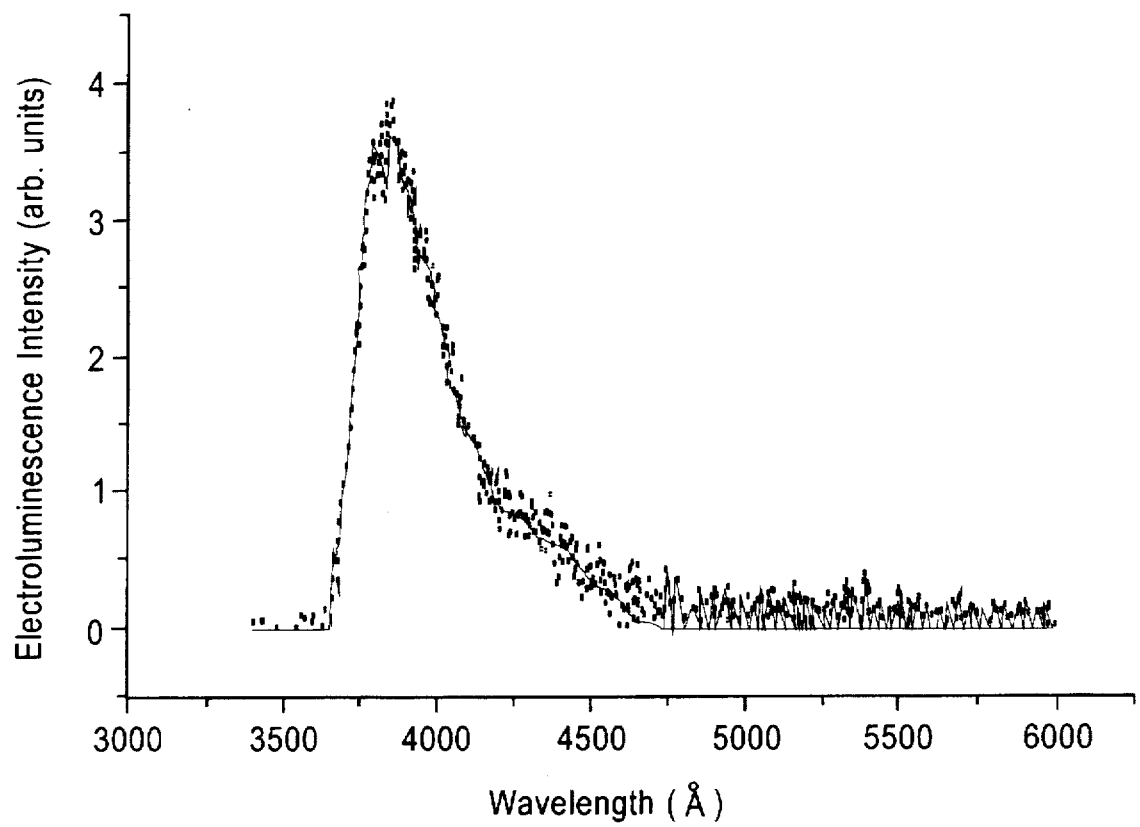
FIG. 3 shows the emission spectrum from an operating GaN light emitting hybrid diode of the invention with no color converter layer.
Figure 4:
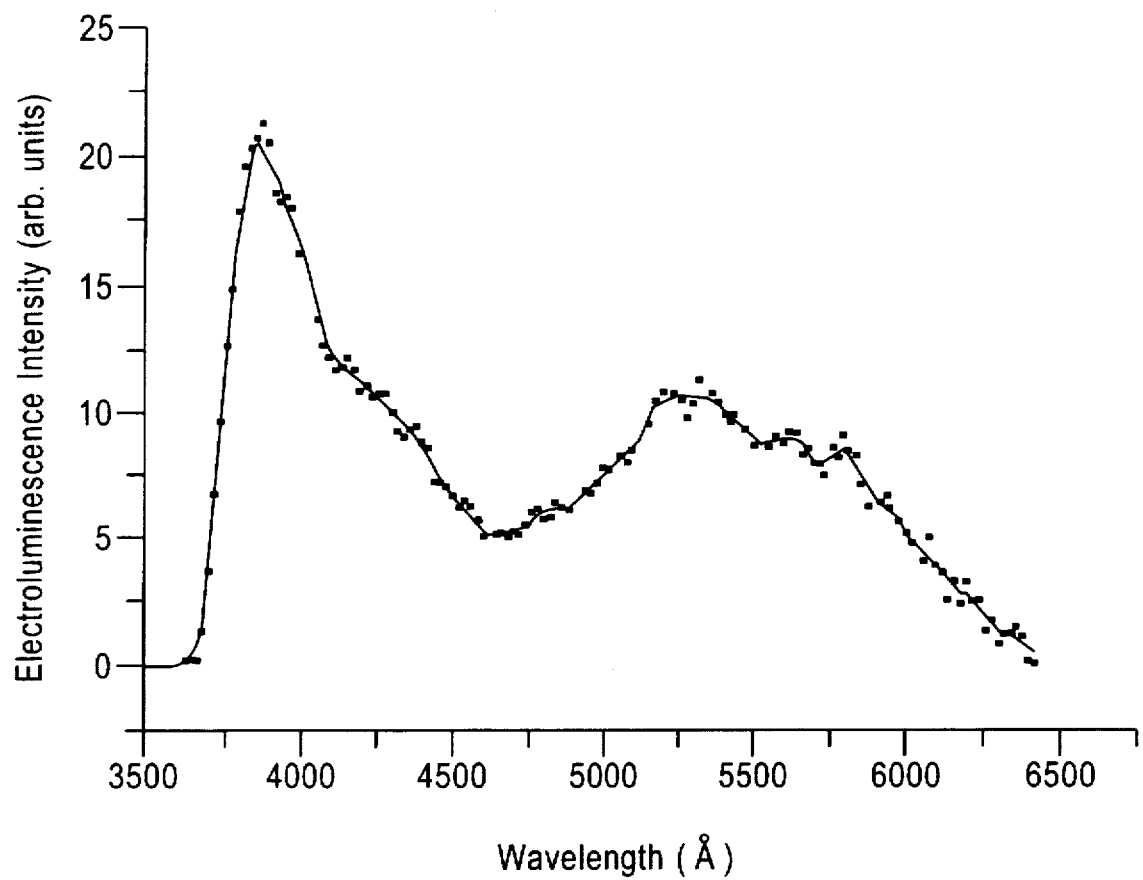
FIG. 4 shows the emission spectrum from an operating GaN light emitting hybrid diode of the invention having a 400 nm thick layer of Alq3 as the color converter layer.

When device 10 is operated by passing electrical current through contacts 16, 18, the GaN structure electroluminesces at region 17 and the emission peaks at 380 nm. The electroluminescence from the GaN device described above is shown in FIG. 3. The emission mechanism may be either of the metal insulator semiconductor (MIS) type as discussed, for example, by B. Goldenberg et al. in Appl. Phys. Lett. 62, 381 (1993) or the p-n junction type as described by S. M. Sze in Physics of Semiconductor Devices, Wiley (New York) Chapt. 12, p. 681 (1981), 2nd Edition. In the p-n junction emission mechanism, electrons injected from the n-doped semiconductor and holes injected from the p-doped semiconductor recombine to generate photons. When the Alq3 is deposited, and the device is operated, the uv emission from the GaN is absorbed by and excites the Alq3 which in turn luminesces resulting in green light emission. This is clearly shown in FIG. 4 which shows the electroluminescence spectrum of an operating device where 400 nm of Alq3 had been deposited onto the substrate side as in FIG. 1. As can be seen, in addition to the uv emission at 390 nm, there is now a broad peak at 530 nm, in the green.

Figure 5:
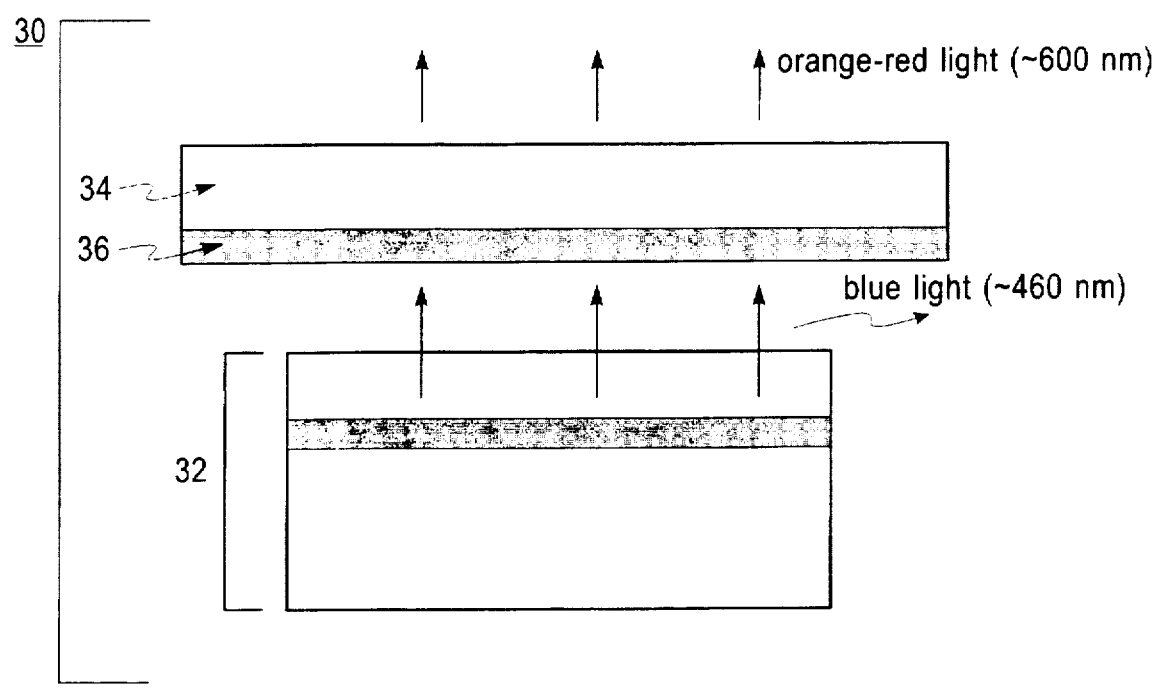
FIG. 5 is a schematic of a hybrid LED consisting of a blue light emitting InGaAlN diode and a color converting (to orange-red) organic thin film composed to DCM.
Figure 6A:
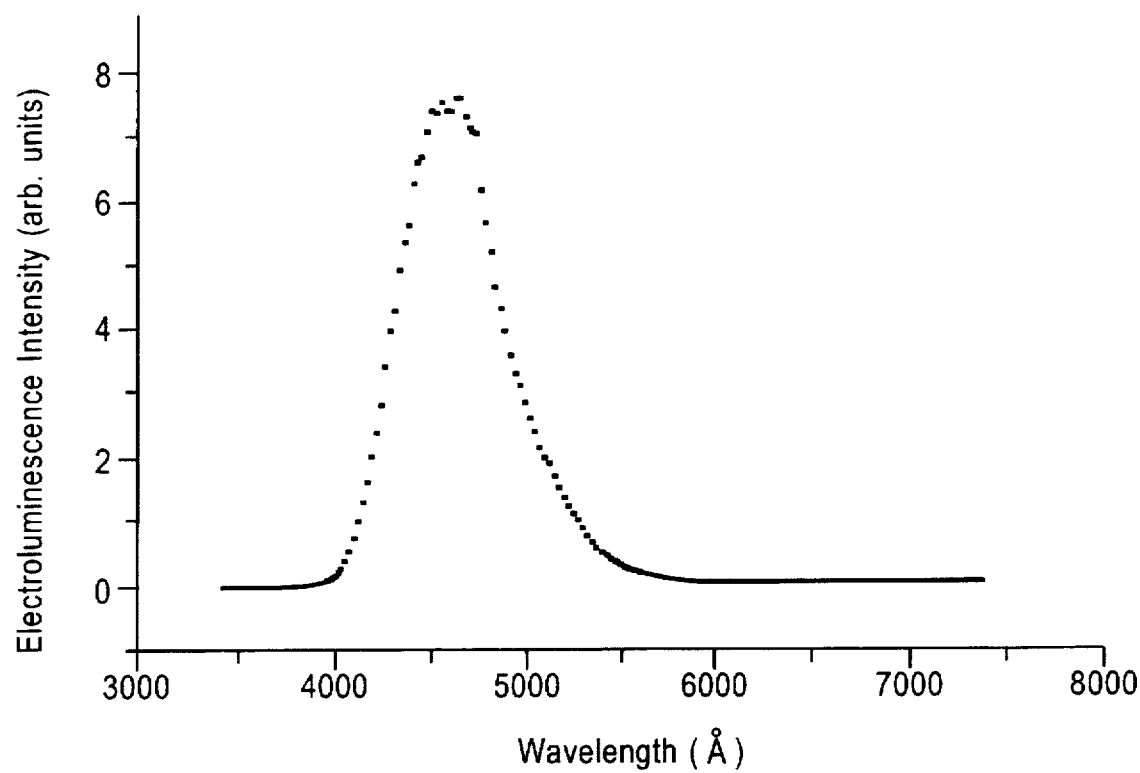
FIGS. 6A and 6B show one electroluminescence spectrum of the blue InGaAlN diode and the color converting hybrid DCM/InGaAlN device of FIG. 5.
Figure 6B:
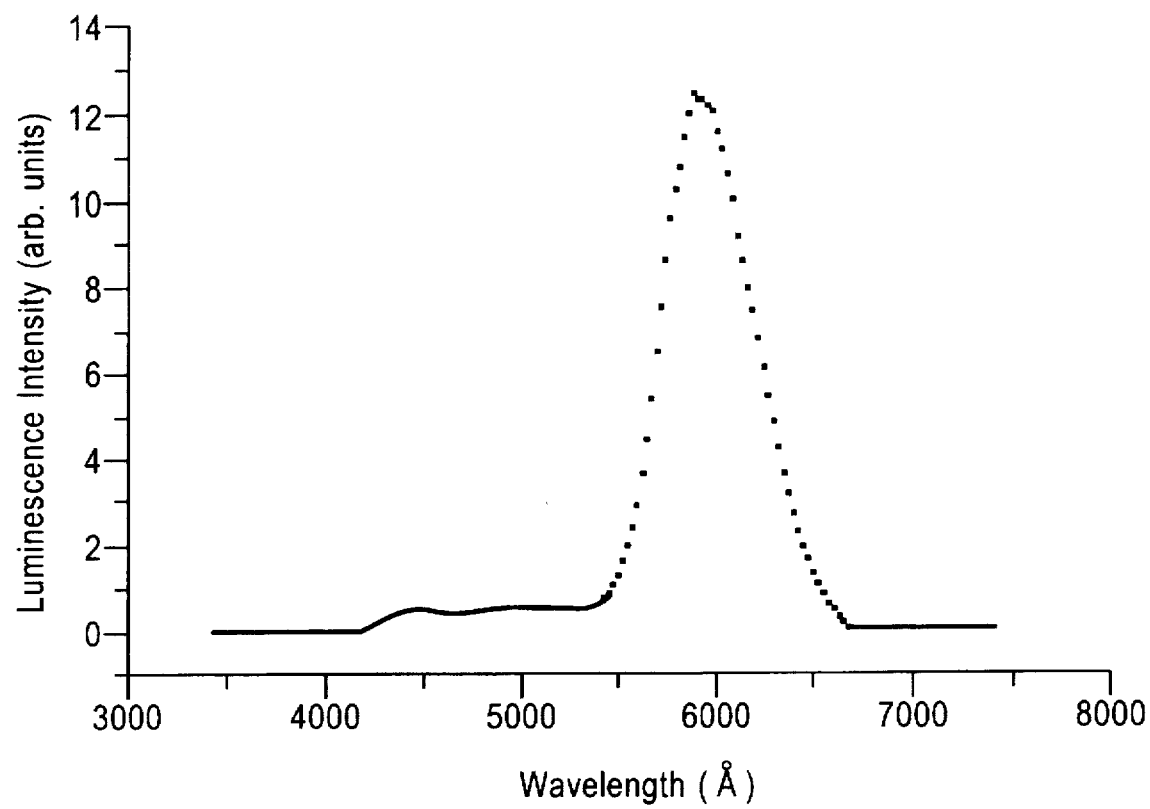

A second embodiment 30 is shown in FIG. 5 and comprises a commercial InGaAlN blue light emitting diode 32 (manufactured by Nichia Chemical Industries Ltd., Japan) configured with a soda lime glass substrate 34 coated with a 2.5 micron thick film 36 of the dye DCM. DCM film 36 was deposited onto glass substrate 34 by inserting a thoroughly solvent cleaned and dried glass substrate into a vacuum chamber held at a base pressure of $2 \times 10^{-8}$ torr. A flux of the dye DCM was then directed onto substrate 34 by thermally evaporating DCM powder held in a pyrolytic boron nitride crucible heated resistively. The evaporated DCM is thus deposited as a luminescent thin film onto the glass substrate. The glass substrate with the DCM thin film is then placed in proximity contact with the InGaAlN based blue LED (with the DCM) thin film side facing the LED). When the InGaAlN based blue LED is turned on, the blue electroluminescence is absorbed by the DCM thin film, which is then photoexicted and luminesces in the orange-red. FIG. 6A shows the electroluminescence spectra of the Nichia InGaAlN blue LED. FIG. 6B shows the electroluminescence spectrum of the hybrid device of the invention described above. It can be clearly seen that color conversion has occurred, the blue emission has been absorbed, and the device now emits in the orange-red. As an additional check to verify that the device indeed works on the principle of orange-red fluorescence by the DCM and not by the filtering through of any orange-red component of the InGaAlN LED itself, an Ealing short pass optical filter that blocks light in the 520–670 nm wavelength and transmits light in the 405–495 nm wavelength was placed in between the InGaAlN LED and the DCM thin film to block any red component of the InGaAlN LED from passing through into the DCM. As was very clear to the naked eye, the DCM was still observed to fluoresce in the orange-red.

A variation on the embodiment of FIG. 1 is one wherein Alq3 layer 20 is replaced with an organic host material doped with dyes which permit the conversion of the light to other wavelengths which can be selected by the choice of dopant. These dopants can be dyes such as Coumarins which produce light in the blue and green region of the spectrum and rhodamines, sulforhodamines, metal-tetrabenz porphorines, and DCM which produce light in the orange to red region of the spectrum. Studies of the fluorescence behavior of these dyes, is described, for example, by Tang et al. in J. Appl. Phys. V65, 3610 (1989), and in Lambdachrome Dyes, by Ulrich Brackmann, in Lambda Physik, GmbH, D-3400, Gottingen.

Figure 6C:
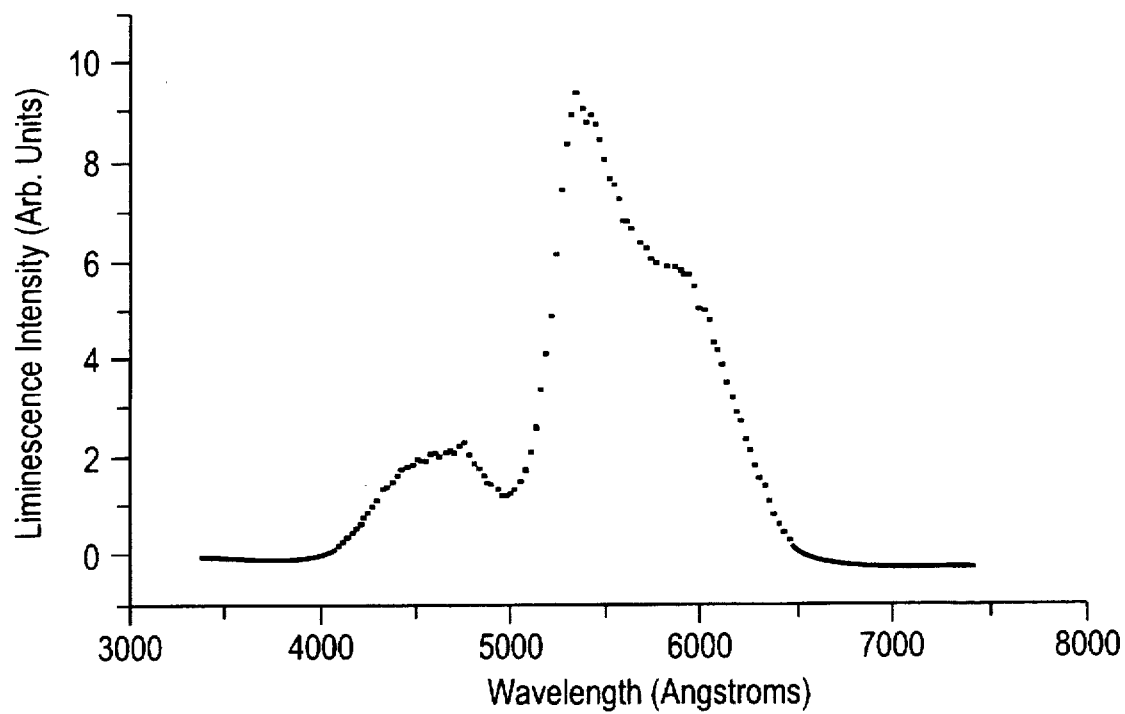
FIG. 6C shows the electroluminescence spectrum from a hybrid LED of the invention wherein the photoluminescent layer is Coumarin 6 doped with 2% DCM.

An example of the case of a host material doped with a dye is that of Coumarin 6 {3-(2'-Benzothiazolyl)-7-diethylaminocoumarin} as host doped with 2% DCM. In this case, the Coumarin 6 and DCM were co-evaporated onto the sodalime glass substrate (layer 34 of FIG. 5). The electroluminescence from this hybrid device is shown in FIG. 6C. On comparison with the Nichia electro-luminescence spectrum of FIG. 6A, the color down conversion (shift to a lower frequency) for the Coumarin 6/2% DCM organic thin film case can clearly be observed. In addition to the 460 nm Nichia LED electroluminescence peak, peaks at about 530 nm and about 590 are also observed. Upon placing a blocking filter that suppresses radiation longer than 520 nm in wavelength between the Nichia LED and the organic film, it was found that the 530 nm peak vanished while the 590 nm peak remained. This indicated that the 590 nm peak was the result of the fluorescence from the DCM dopant while the 530 nm peak was the result of the filtered long wave component of the Nichia electroluminescence.

Figure 6D:
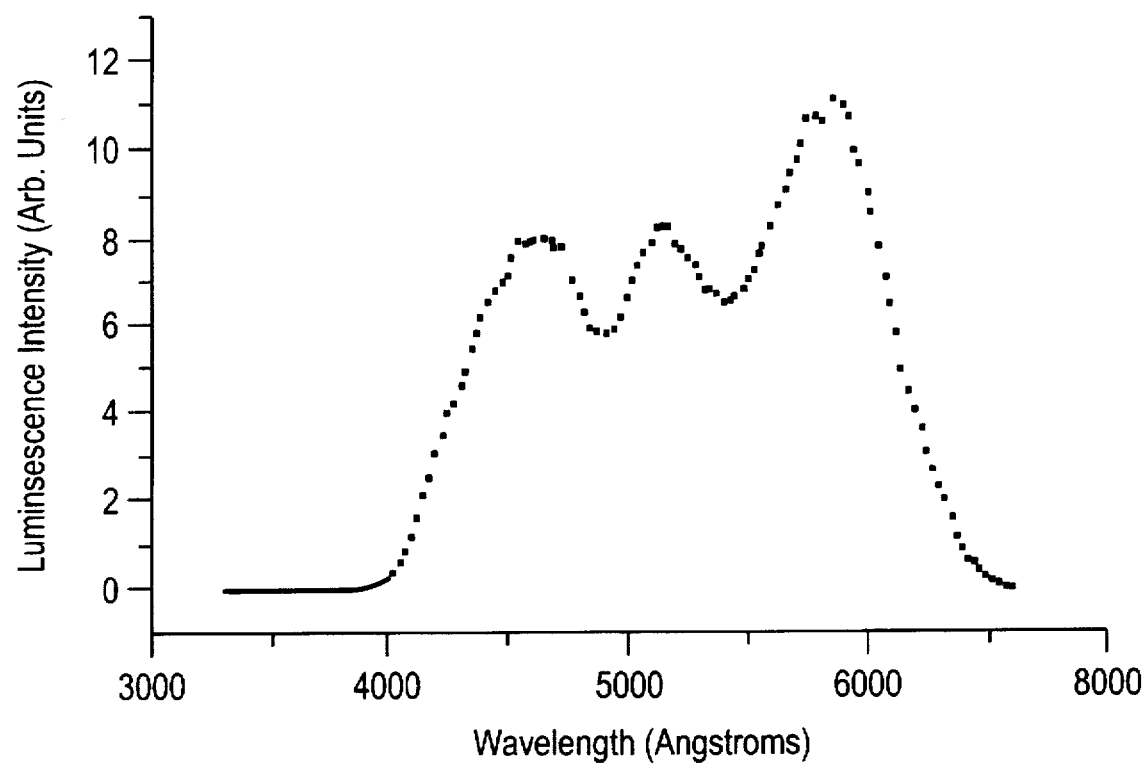
FIG. 6D shows the electroluminescence spectrum from a hybrid LED of the invention wherein the photoluminescent layer is Coumarin 7 doped with 2% DCM.

The electroluminescence spectrum from the case of Coumarin 7 {3-(2'-Benzimidazolyl)-7-N,N-diethylaminocoumarin} as host doped with 2% DCM is shown in FIG. 6D. Again, these constituents were co-evaporated. In this case, three peaks may be observed as well around 460 nm, 515 nm and 590 nm with the 590 nm peak corresponding to fluorescence from the DCM dopant.

The host material itself can be an organic film that absorbs the electroluminescent radiation from the GaN diode and transfers the excitation to the dopant. Such a host can be Alq3 (for use with green, red, and blue emitting dopants) or a Coumarin (for use with red dopants). As discussed above, suitable materials for the substrate (21) include sapphire, silicon and SiC.

For the host to transfer the excitation efficiently to the dopant, there should be a good overlap between the host emission spectrum and the dopant absorption spectrum so that the host molecule itself does not relax by photon emission. In the same context, the dopant absorption and emission spectra should be as far separated as possible to avoid self quenching effects.

Vacuum deposition of organic films with substrates held at room temperature can result in films with high surface roughness. For example, a 2.5 micron thick DCM film deposited on a sodalime glass substrate held at room temperature exhibited a surface roughness amplitude of approximately 0.5 microns as measured by a surface profiler. This is undesirable for two reasons. Firstly, rough films will create problems during patterning of the organic films. Secondly, enhanced scattering of the fluorescence can occur. It has been found that film deposition on substrates held at about 77° K. reduces surface roughness. For example, deposition of a Coumarin 6/2% DCM film on a sodalime glass substrate held on a liquid nitrogen cooled cold finger so that the substrate temperature was close to 77° K. during deposition resulted in an as-deposited shiny, specular film with markedly improved morphology and roughness of less than about 100 nm, typically 50 nm. As extracted from the vacuum chamber, the film was of an amorphous/finely polycrystalline nature. However, over a few hours at room temperature, some recrystallization and/or grain growth (evidenced by dendritic patterns) was observed by optical microscopy. The surface smoothness of the film was, however, preserved and remained superior to room temperature deposited films.

Figure 7:
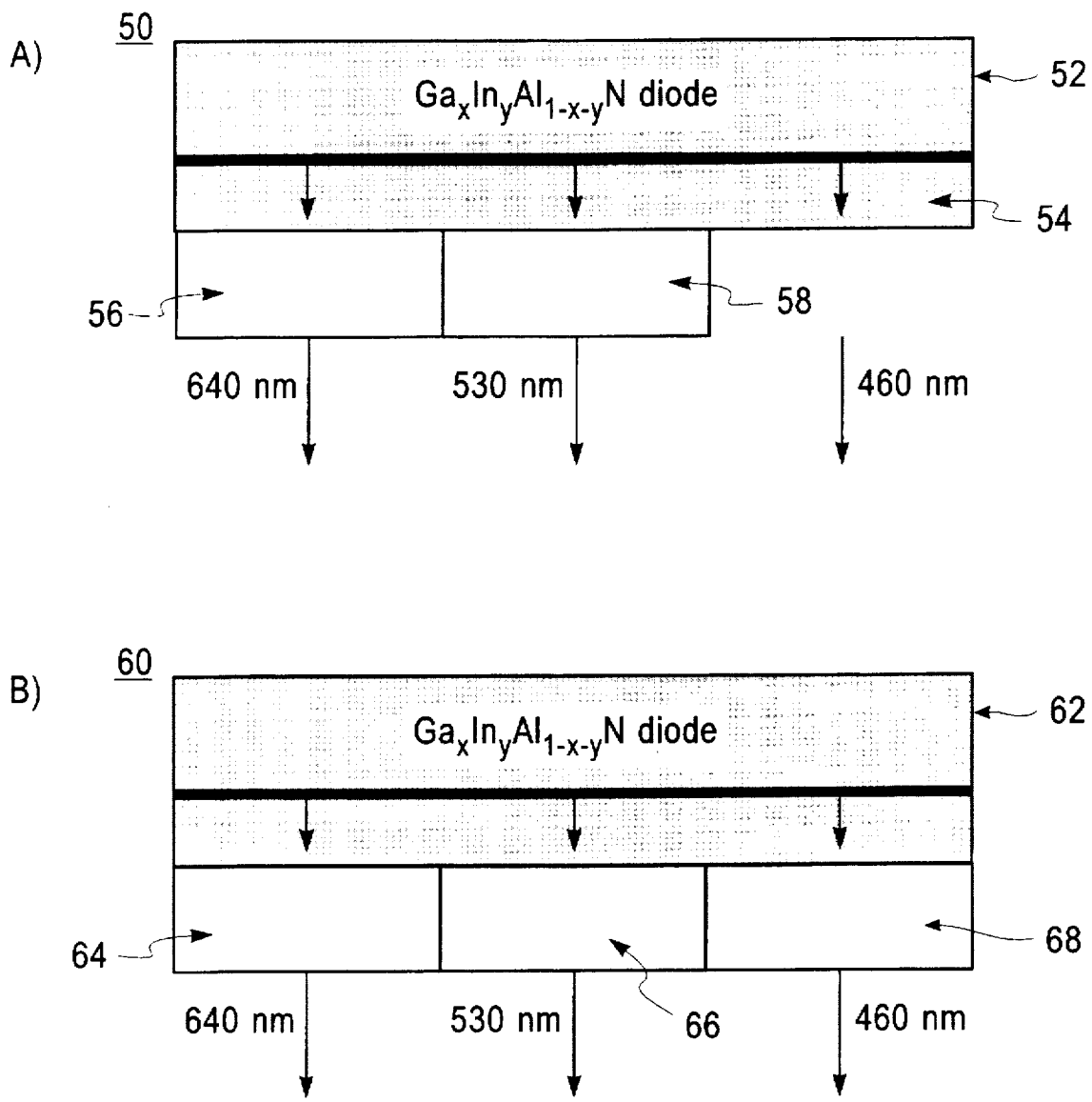
FIGS. 7A and 7B show schematically two structures for a multicolor hybrid organic/inorganic LED pixel.

FIG. 7 schematically shows two embodiments 50, 60 of a multi-colored, hybrid LED pixel. In FIG. 7A, GaInAlN diode 52 emits light at 460 nm. In uncovered region 54, 460 nm blue light is emitted. In the regions where red 56 or green 58 color converters are patterned either red or green light will be emitted. If all three regions are driven the pixel will emit light that appears white to the eye since all three principal colors are present in the far field white light. In FIG. 7B, GaInAlN diode 62 is displayed whose concentrations of Al and In are adjusted to give emission in the UV (<400 nm). This UV light is then used to excite red 64, green 66 and blue 68 organic color converters.

As an alternative to thermal evaporation, it is also possible to dissolve fluorescent organic dyes in liquid materials such as poly-methyl methacrylate, and spun onto the GaN diode followed by curing. This technique is advantageous as it can be practiced in air without need for vacuum equipment.

In addition to their other advantages, the hybrid LEDs of the present invention provide greatly increased efficiencies compared to present state of the art LEDs. Good GaN based LEDs typically have high "wallplug" efficiencies (energy emitted/power in) of nearly 10%. While Alq3 has a fluorescent efficiency of about 10%, other color converter materials possess efficiencies of greater than 90% (see, e.g., Tang et al. J. Appl. Phys. V. 65, 3610 (1989), H. Nakamura, C. Hosokawa, J. Kusumoto, Inorganic and Organic Electroluminescence/EL 96, Berlin, and Wissenschaft und Technik Verl., R. H. Mauch and H. E. Gumlich eds., 1996, pp. 95–100). Therefore, wallplug efficiencies of nearly 10% are possible with the present invention. This compares very favorably with fully organic LEDs whose highest efficiencies have been reported to be 3–4%, but are typically 1%.

Presently, commercial green and blue LEDs are based on the GaN system while red LEDs are based on the InGaAlP system. The hybrid LED structure of this invention provides the different colors by changing only the photoluminescent layer without any changes in the current transporting layers which is a simpler and more convenient approach for making light emitting diodes of different colors.

Compared to fully organic LEDs, the hybrid LEDs of this invention present the advantage that the organic layer does not participate in any electrical transport activities since the electrical transport process is isolated to the inorganic semiconductor part of the device. The organic part thus participates only as a photoluminescent layer. This is particularly advantageous since organic LEDs tend to degrade during electrical operation (electroluminescence) in air. This process is believed to be accelerated by atmospheric moisture and extensive sealing/packaging techniques have to be used to minimize this problem. GaN based electroluminescent devices on the other hand do not suffer from degradation problems and thus extend this advantage to the hybrid light emitting diodes.

The hybrid LEDs of this invention can also make the fabrication of display arrays easier since organic layers may be selectively spatially deposited (for instance through mask sets) onto an array of identical uv GaN diodes to then obtain a pixelated full color LED display.

Figure 8:
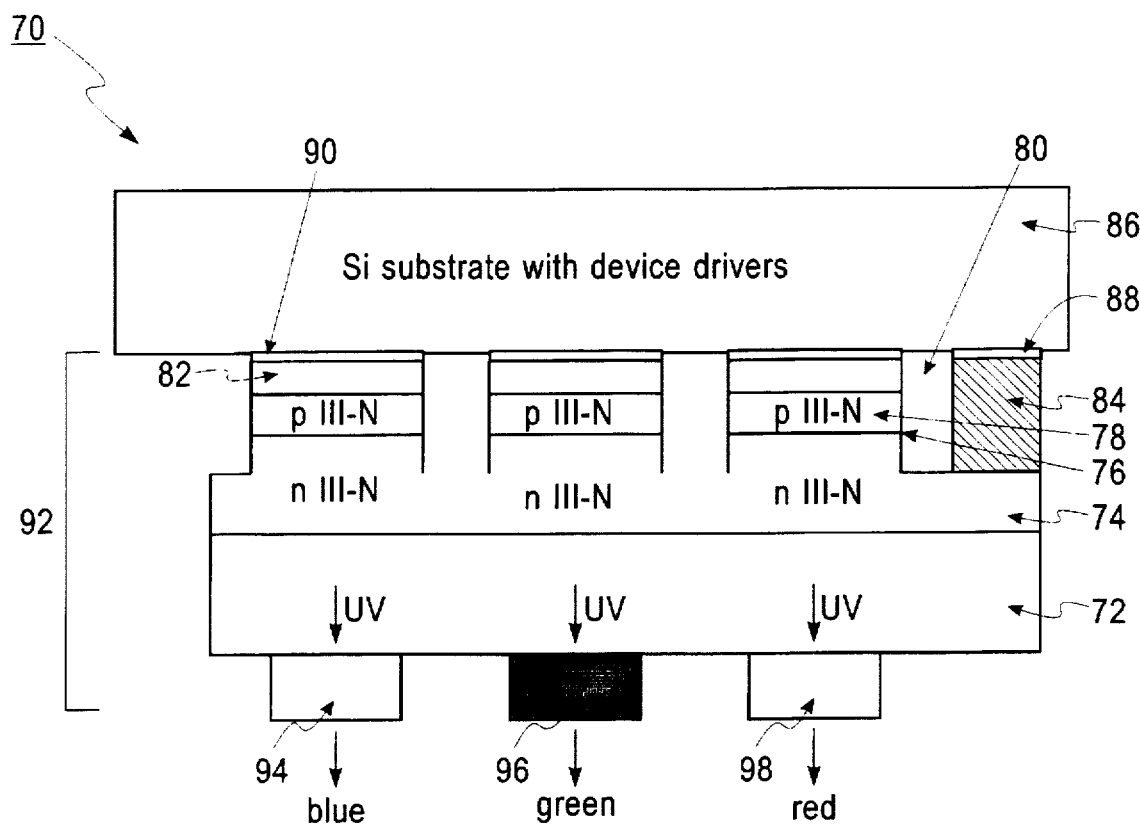
FIG. 8 shows an example of a pixelated full color display array using hybrid light emitting diodes of the invention with monolithic silicon based display drivers.

An example of this is shown in FIG. 8. FIG. 8 shows part of a possible full color display 70 made of arrays of hybrid LEDs of the invention integrated with silicon based device drivers. FIG. 8 shows a set of three pixels emitting in the three primary colors. Repetition of this basic set results in the display array. The display may be fabricated in the following manner. A GaAlInN (henceforth referred to as III-N, the notation III referring to the periodic table column to which Ga, Al, and In belong) LED structure is deposited on a transparent sapphire substrate 72 polished on both sides. The LED structure may be deposited by a standard epitaxial growth technique such as metal organic chemical vapor deposition or molecular beam epitaxy and consists in sequence of an n-doped III-N layer 74 for electron injection, an active III-N layer 76 for light generation by electron-hole recombination, and a p-doped III-N layer 78 for hole injection. The composition of the active layer is so chosen as to result in the emission of ultra violet light.

Following deposition, arrays of isolated LED pixels (each pixel consisting of layers 74, 76, and 78) that form the display are created by etching trenches 80 by a standard etching technique such as reactive ion etching. Electrical contacts 82 and 84 are made to the p-layer 78 and the n-layer 74 by inserting the wafer in a vacuum chamber and depositing appropriate metals. As an example, Au and Ni layers may be used to define the p contact metallurgy and Ti and Al layers to define the n contact metallurgy. The sapphire wafer with the LED array patterned on it is now mated with a Si wafer 86 containing the device drivers as follows. The Si wafer contains driver electronics patterned onto it by standard Si processing techniques. The drivers deliver power to the individual LEDs through metal contacts 88 and 90 that connect to the n- and p-contacts 82 and 84 of the III-N LEDs and these two sets of electrical contacts are positioned and aligned so as to match up with one another.

The alignment between the Si device driver wafer 86 and the LED array wafer 92 may be made using a mask aligner and placing the LED array wafer on top of the Si driver wafer so that the electrical contact sides of each wafer face each other. Viewing through an optical microscope from the transparent sapphire side of the LED array wafer, the two wafers may now be mechanically positioned to align the electrical contacts. Following alignment, the contacts may be diffusion bonded in regions 88, 90 by heating the Si device driver wafer/LED array wafer sandwich while applying pressure. The diffusion bonded wafer sandwich is then thinned down from the sapphire substrate side 72 so that the sapphire substrate thickness is reduced to about 10–20 microns. The sample is then inserted into a vacuum chamber and blue, green, and red organic dyes are deposited onto the sapphire side by evaporating the organic dyes through a shadow mask placed in proximity contact with the sapphire surface to create regions 94, 96, 98, respectively. The mask is placed so that each color dye is aligned with each LED pixel. On completion of the deposition of the organic dyes the fabrication of the display is complete.

The technical papers and other references cited above are hereby incorporated herein by reference.

While this invention has been described in terms of preferred embodiments thereof, it will be appreciated by those having skill in the art that variations may be made in the invention without departing from the spirit and scope of the invention. For example, other materials could be used or developed as substitutes for those noted, and different assembly techniques and procedures could be employed. Accordingly, the scope of the invention is to be limited only by the following claims.

What is claimed is:

1. A hybrid organic-inorganic semiconductor light emitting diode comprising a layer of a light emitting, inorganic electroluminescent material and an overlying layer of an organic photoluminescent material, said organic photoluminescent material comprising a host material doped with dye molecules, wherein said host material is Coumarin 6 doped with 2% DCM.

2. A hybrid organic-inorganic semiconductor light emitting diode comprising a layer of a light emitting, inorganic electroluminescent material and an overlying layer of an organic photoluminescent material, said organic photoluminescent material comprising a host material doped with dye molecules, wherein said host material is Coumarin 7 doped with 2% DCM.

3. A hybrid organic-inorganic semiconductor light emitting diode comprising a layer of a light emitting, inorganic electroluminescent material and an overlying layer of an organic photoluminescent material, wherein said organic photoluminescent layer has an as-deposited surface roughness amplitude of about 100 nm or less.

4. A hybrid organic-inorganic semiconductor light emitting diode comprising a layer of a light emitting, inorganic electroluminescent material and an overlying layer of an organic photoluminescent material which has an as-deposited amorphous finely polycrystalline morphology.

5. A hybrid organic-inorganic semiconductor light emitting diode comprising, in sequence, a substrate, a n-doped semiconductor layer, a light emission region where electrons and holes recombine to produce light, a p-doped semiconductor layer, and a layer of an organic photoluminescent material which comprises a single fluorescent compound.

6. A diode as set forth in claim 5, wherein said single fluorescent compound is Alq3.

7. A diode as set forth in claim 5, wherein said single fluorescent compound is DCM.

8. A hybrid organic-inorganic semiconductor light emitting diode comprising, in sequence, a substrate, a n-doped semiconductor layer, a light emission region where electrons and holes recombine to produce light, a p-doped semiconductor layer, and a layer of an organic photoluminescent material which comprises a fluorescent compound or combination of compounds which absorb light at the wavelength emitted by said light emission region and re-emit light at a different wavelength.

9. A hybrid organic-inorganic semiconductor light emitting diode comprising, in sequence, a substrate, a n-doped semiconductor layer, a light emission region where electrons and holes recombine to produce light, a p-doped semiconductor layer, and a layer of an organic photoluminescent material which comprises a host material doped with dye molecules selected from the group consisting of Coumarins, rhodamines, sulforhodamines, DCM, and metal porphorine.

10. A diode as set forth in claim 9, wherein said host material is a Coumarin.

11. A diode as set forth in claim 9, wherein said host material is Coumarin 6 doped with 2% DCM.

12. A diode as set forth in claim 9, wherein said host material is Coumarin 7 doped with 2% DCM.

13. A hybrid organic-inorganic semiconductor light emitting diode comprising, in sequence, a substrate, a n-doped semiconductor layer, a light emission region where electrons and holes recombine to produce light, a p-doped semiconductor layer, and a layer of an organic photoluminescent material, wherein said organic photoluminescent layer has an as-deposited surface roughness amplitude of about 100 nm or less.

14. A hybrid organic-inorganic semiconductor light emitting diode comprising, in sequence, a substrate, a n-doped semiconductor layer, a light emission region where electrons and holes recombine to produce light, a p-doped semiconductor layer, and a layer of an organic photoluminescent material, wherein said organic photoluminescent layer has an as-deposited amorphous finely polycrystalline morphology.

* * * * *